(12) United States Patent
Nihtianov et al.

(10) Patent No.: US 8,138,485 B2
(45) Date of Patent: Mar. 20, 2012

(54) RADIATION DETECTOR, METHOD OF MANUFACTURING A RADIATION DETECTOR, AND LITHOGRAPHIC APPARATUS COMPRISING A RADIATION DETECTOR

(75) Inventors: Stoyan Nihtianov, Eindhoven (NL); Arie Johan Van Der Sijs, Veldhoven (NL); Bearrach Moest, Eindhoven (NL); Petrus Wilhelmus Joseph Maria Kemper, Waalre (NL); Marc Antonius Maria Haast, Eindhoven (NL); Gerardus Wilhelmus Petrus Baas, Weert (NL); Lis Karen Nanver, Zoetermeer (NL); Francesco Sarubbi, Delft (NL); Antonius Andreas Johannes Schuwer, Waalwijk (NL); Gregory Micha Gommeren, Wouw (NL); Martijn Pot, Den Ham (NL); Thomas Ludovicus Maria Scholtes, Dordrecht (NL)

(73) Assignee: ASML Netherlands B.V., Veldhoven (NL)

( * ) Notice: Subject to any disclaimer, the term of this patent is extended or adjusted under 35 U.S.C. 154(b) by 405 days.

(21) Appl. No.: 12/144,874

(22) Filed: Jun. 24, 2008

(65) Prior Publication Data
US 2009/0021717 A1 Jan. 22, 2009

Related U.S. Application Data

(63) Continuation-in-part of application No. 11/819,160, filed on Jun. 25, 2007, now Pat. No. 7,586,108.

(51) Int. Cl.
*G21K 5/00* (2006.01)

(52) U.S. Cl. .................. 250/492.1; 250/372; 250/492.2; 257/290; 257/291; 257/292; 257/461; 257/464

(58) Field of Classification Search .................. 250/372, 250/492.1, 492.2; 257/290, 291, 292, 461, 257/463, 464
See application file for complete search history.

(56) References Cited

U.S. PATENT DOCUMENTS 5,682,037 A * 10/1997 de Cesare et al. ............. 250/372
(Continued)

FOREIGN PATENT DOCUMENTS

JP 64-084673 A 3/1989
(Continued)

OTHER PUBLICATIONS

Notice of Allowance mailed Jun. 18, 2009 for U.S. Appl. No. 11/819,160, 8 pgs.
(Continued)

*Primary Examiner* — Michael Maskell
(74) *Attorney, Agent, or Firm* — Sterne, Kessler, Goldstein & Fox, P.L.L.C.

(57) ABSTRACT

A radiation detector, a method of manufacturing a radiation detector, and a lithographic apparatus comprising a radiation detector. The radiation detector has a radiation sensitive surface. The radiation sensitive surface is sensitive to radiation wavelengths between 10-200 nm and charged particles. The radiation detector has a silicon substrate, a dopant layer, a first electrode, and a second electrode. The silicon substrate is provided in a surface area at a first surface side with doping profile of a certain conduction type. The dopant layer is provided on the first surface side of the silicon substrate. The dopant layer has a first layer of dopant material and a second layer. The second layer is a diffusion layer in contact with the surface area at the first surface side of the silicon substrate. The first electrode is connected to dopant layer. The second electrode is connected to the silicon substrate.

29 Claims, 4 Drawing Sheets

U.S. PATENT DOCUMENTS

| | | | |
|---|---|---|---|
| 5,719,414 A | 2/1998 | Sato et al. | |
| 6,066,510 A * | 5/2000 | Merrill | 438/57 |
| 6,593,636 B1 * | 7/2003 | Bui et al. | 257/463 |
| 6,777,729 B1 * | 8/2004 | Prince et al. | 257/292 |
| 6,803,581 B2 * | 10/2004 | Prince et al. | 250/372 |
| 7,279,731 B1 * | 10/2007 | Bui et al. | 257/292 |
| 7,576,369 B2 * | 8/2009 | Bui et al. | 257/127 |
| 7,586,108 B2 | 9/2009 | Nihtianov et al. | |
| 2004/0021085 A1 * | 2/2004 | Prince et al. | 250/372 |
| 2005/0173647 A1 * | 8/2005 | Bakker | 250/372 |
| 2007/0045682 A1 * | 3/2007 | Hong et al. | 257/292 |
| 2008/0315121 A1 | 12/2008 | Nihtianov et al. | |
| 2010/0032710 A1 * | 2/2010 | Bui et al. | 257/127 |

FOREIGN PATENT DOCUMENTS

| | | |
|---|---|---|
| JP | 07-240534 A | 9/1995 |

OTHER PUBLICATIONS

Funsten et al., "Response of 100% Internal Quantum Efficiency Silicon Photoiodes to 200 eV-40 keV Electrons," IEEE Transactions on Nuclear Science, 44:6, Dec. 1997.

Stoyan Nihtianov et al., U.S. Appl. No. 11/819,160, filed Jun. 25, 2007, titled "Radiation detector, method of manufacturing a radiation detector and lithographic apparatus comprising a radiation detector."

Singapore Written Opinion for Application No. 0804824-1 mailed May 5, 2010, 5 pgs.

Canfield et al., "Silicon Photodiodes with Integrated Thin Film Filters for Selective Bandpasses in the Extreme Ultraviolet", SPIE vol. 2282, pp. 31-37, *Ultraviolet Technology V*, 1994.

Kjornarattanawanich et al., "Temperature Dependence of the EUV Responsivity of Silicon Photodiode Detectors", *IEEE Transactions on Electron Devices*, vol. 53, No. 2, Feb. 2006, pp. 218-223.

Korde et al., "Present Status of Radiometric Quality Silicon Photodiodes", *Metrologia 40*, Feb. 7, 2003, Institute of Physics Publishing Ltd, S145-S149.

Buisman, K. et al., ""Distortion-Free" Varactor Diode Topologies for RF Adaptivity", *IEEE*, 157-160, Laboratory of High-Frequency Technology & Components, Electronic Components, Technology and Materials, Delft University of Technology, University of California, San Diego (2005).

Buisman, K. et al., "Low-Distortion, Low-Loss Varactor-Based Adaptive Matching Networks, Implemented in a Silicon-on-Glass Technology", *IEEE*, 389-392, DIMES, Delft University of Technology and University of California, San Diego (2005).

Buisman, K. et al., "Varactor-Topologies for RF Adaptivity with Improved Power Handling and Linearity", *IEEE*, 319-322, Department of Microelectronics, DIMES, Delft University of Technology, University of California, San Diego (2007).

Busen, K.M. et al., "Ellipsometric Investigations of Boron-Rich Layers on Silicon", *J. Electrochem. Soc.*, 291-294, Research and Development Laboratories, Sprague Electric Company, North Adams, Massachusetts (Mar. 1968).

Huang, C. et al., "A 67 dBm $OIP_3$ Multistacked Junctiion Varactor", *IEEE Microwave and Wireless Components Letters* vol. 18 11:749-751, Delft University of Technology (Nov. 2008).

Huang, C. et al., "Enabling Low-Distortion Varactors for Adaptive Transmitters", *IEEE Transactions on Microwave Theory ad Techniques* vol. 56 5:1149-1163 (May 2008).

Kim, K. et al., "A novel doping technology for ultra-shallow junction fabrication: boron diffusion from boron-adsorbed layer by rapid thermal annealing", *This Solid Films 369*:207-212, Elsevier (2000).

Kiyota, Y. et al., "Characteristics of Shallow Boron-Doped Layers in Si by Rapid Vapor-Phase Direct Doping", *J. Electrochem. Soc.* vol. 140 4:1117-1121, The Electrochemical Society, Inc. (Apr. 1993).

Kiyota, Y. et al., "Sticking coefficient of boron and phosphorus on silicon during vapor-phase doping", *J. Vac. Sci. Technol.* vol. A 19 5:2441-2445, American Vacuum Society (2001).

Tseng, H.-C., et al., "Characterization of boron silicide layer deposited by ultrahigh-vacuum chemical-vapor deposition", *J. Appl. Phys*, vol. 80 9:5377-5383, American Institute of Physics (Nov. 1996).

Corrected Singapore Search and Examination Report directed to related Singapore Patent Application No. 200804824-1, Intellectual Property Office of Singapore, dated Mar. 24, 2011; 7 pages.

English Language abstract for JP 07-240534 A, published Sep. 12, 1995, 1 page.

English Language translation of Japanese language Notice of Reasons for Rejection directed to related Japanese Patent Application No. JP 2008-158609 A, mailed on Nov. 2, 2010 from the Japan Patent Office; 2 pages.

Scotten W. Jones, IC Knowledge LLC, *Diffusion in Silicon* (2000).

R.B. Fair, *Concentration Profiles of Diffuse Dopants in Silicon*, in F.Y.Y. Yang, Ed., *Impurity Dopant Processes in Silicon*, North Holland (1981).

\* cited by examiner

RADIATION DETECTOR, METHOD OF MANUFACTURING A RADIATION DETECTOR, AND LITHOGRAPHIC APPARATUS COMPRISING A RADIATION DETECTOR

CROSS-REFERENCE TO RELATED APPLICATIONS

This application is a continuation-in-part of U.S. patent application Ser. No. 11/819,160, filed Jun. 25, 2007 (that issued as U.S. Pat. No. 7,586,108 on Sep. 8, 2009), the entire content of which is incorporated herein by reference.

FIELD

The present invention relates to a radiation detector having a radiation sensitive surface, a method of manufacturing a radiation detector for detecting radiation, and a lithographic apparatus comprising a radiation detector.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction. It is also possible to transfer the pattern from the patterning device to the substrate by imprinting the pattern onto the substrate.

In device manufacturing methods using lithographic apparatus, an important factor is the yield, i.e., the percentage of correctly manufactured devices. One factor affecting yield is the accuracy within which layers are printed in relation to layers that have previously been formed. This is known as overlay and the overlay error budget will often be 10 nm or less. To achieve such accuracy, the substrate must be aligned to the reticle pattern to be transferred with great accuracy.

A number of sensors are used at substrate level for evaluating and optimizing imaging performance. These may include transmission image sensors (TIS). A TIS is a sensor that is used to measure at substrate level the position of a projected aerial image of a mark pattern at mask (reticle) level. The projected image at substrate level may be a line pattern with a line width comparable to the wavelength of the exposure radiation. The TIS measures the aforementioned mark pattern using a transmission pattern with a photocell, i.e., a radiation detector, underneath it. The sensor data may be used to measure the position of the reticle with respect to the substrate table in six degrees of freedom, i.e., three degrees of freedom related to translation and three degrees of freedom related to rotation. Moreover, magnification and scaling of the projected mark pattern may be measured.

At wavelengths between about 10-200 nm, the radiation sensitive surface of the radiation detector of a conventional TIS deteriorates within a limited time frame. As a result, the TIS has a limited lifetime. With the continual desire to image ever smaller patterns to create device with higher component densities, there is pressure to reduce the wavelengths used. In order to maintain or reduce overlay errors, there exists a need for a more robust TIS.

SUMMARY

It is desirable to provide a radiation detector at substrate level with high sensitivity so that it can be used to detect radiation with wavelengths between about 10-200 nm with an improved lifetime.

According to an embodiment of the invention, there is provided a radiation detector having a radiation sensitive surface. The radiation detector comprises a silicon substrate having a surface area at a first surface side with a doping profile. The radiation detector further comprises a dopant layer provided on the first surface side of the silicon substrate, the dopant layer comprising a first layer of dopant material and a second layer, the second layer being a diffusion layer which is in contact with the surface area at the first surface side of the silicon substrate. The radiation detector further comprises a first electrode connected to the dopant layer and a second electrode connected to the silicon substrate. The surface area at the first surface side of the silicon substrate and the second layer are arranged to form the radiation sensitive surface.

Additionally, in another embodiment, the invention provides a lithographic exposure apparatus for exposing a substrate with a patterned beam of radiation, comprising a radiation detector.

In a further embodiment of the invention, there is provided a method of manufacturing a radiation detector for detecting radiation, including providing a silicon substrate with a first surface side and a second surface side opposite thereto, wherein the silicon substrate has a surface area at the first surface side with a doping profile, depositing a layer of dopant material on top of the first surface of the silicon substrate such that in the silicon substrate a diffusion layer is formed and so that the surface area at the first surface and a second layer are arranged to form a radiation sensitive surface, partly covering the layer of dopant material with a first contact comprising a conducting material such that first regions and second regions are formed, wherein the layer of dopant material is covered with the first contact material in the first regions and remains exposable to the radiation in the second regions and depositing a second contact comprising a conducting material at the second surface side of the silicon substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
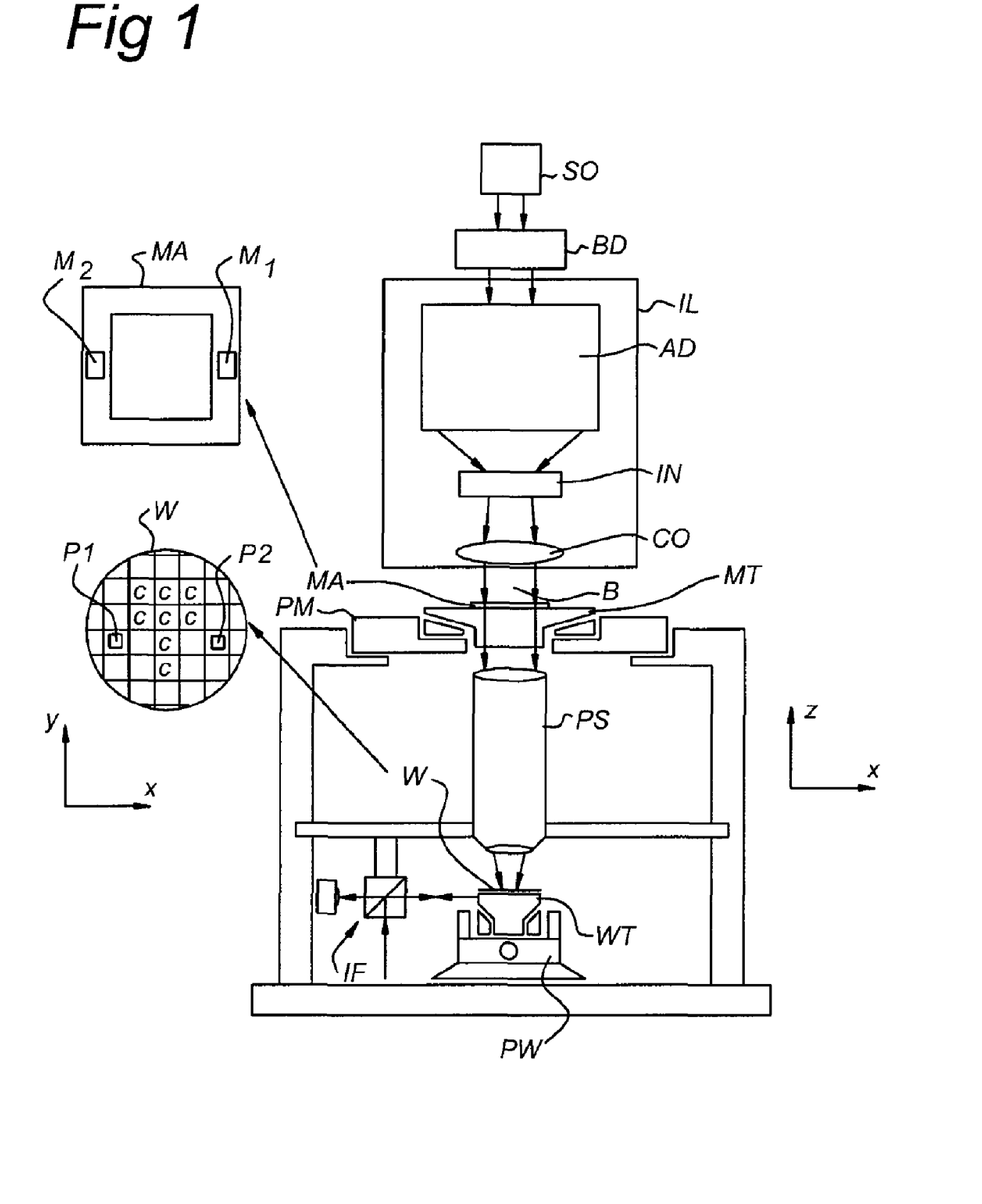
FIG. 1 depicts a lithographic apparatus, according to an embodiment of the invention.

FIG. 1 depicts a lithographic apparatus according to one embodiment of the invention. The apparatus includes an illumination system (illuminator) IL configured to condition a radiation beam B (e.g. UV radiation or EUV radiation), a support structure (e.g., a mask table) MT constructed to support a patterning device (e.g., a mask) MA and connected to a first positioner PM configured to accurately position the patterning device in accordance with certain parameters, a substrate table (e.g., a wafer table) WT constructed to hold a substrate (e.g., a resist coated wafer) W and connected to a second positioner PW configured to accurately position the substrate in accordance with certain parameters, and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic, or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic, or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic, and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder, or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1 and M2, and substrate alignment marks P1 and P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e., a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e., a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
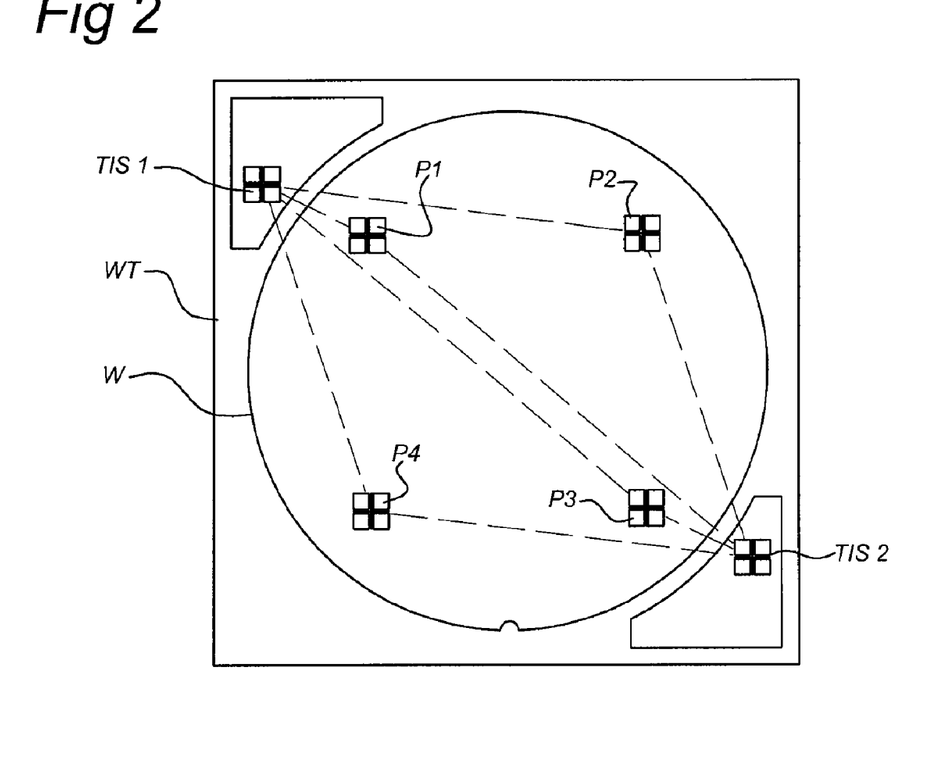
FIG. 2 depicts an arrangement of the substrate table depicted in the lithographic apparatus of FIG. 1.

FIG. 2 depicts an arrangement of the substrate table WT depicted in the lithographic apparatus of FIG. 1. On the substrate table WT, two fixed marks TIS 1 and TIS 2 are provided. The fixed markers TIS 1 and TIS 2 have integrated into them an image sensor that can be used to determine a location of an aerial image of an object mark on the mask MA by scanning the image sensor through the aerial image. The image sensor is substantially positioned in the substrate plane, i.e., the plane in which substrate W is located if positioned on the substrate table WT. Consequently, the relative position of the image of the object mark on the mask MA and the fixed marks TIS 1 and TIS 2 can be determined. If the substrate table WT is provided with a substrate W comprising substrate marks, e.g., substrate marks P1, P2, P3, and P4 as depicted in FIG. 2, an alignment sensor (not shown) may previously obtain relative positions of the substrate marks P1, P2, P3, and P4. The knowledge of the relative positions of the substrate marks P1, P2, P3, and P4 obtained by the alignment sensor combined with the knowledge of the relative position of the image of the object mark on the mask MA and the fixed marks TIS 1 and TIS 2 measured by the image sensors within TIS 1 and TIS 2, allow the substrate W to be positioned at any desired position relative to the projected image of the mask MA with a high degree of accuracy.

Figure 3:
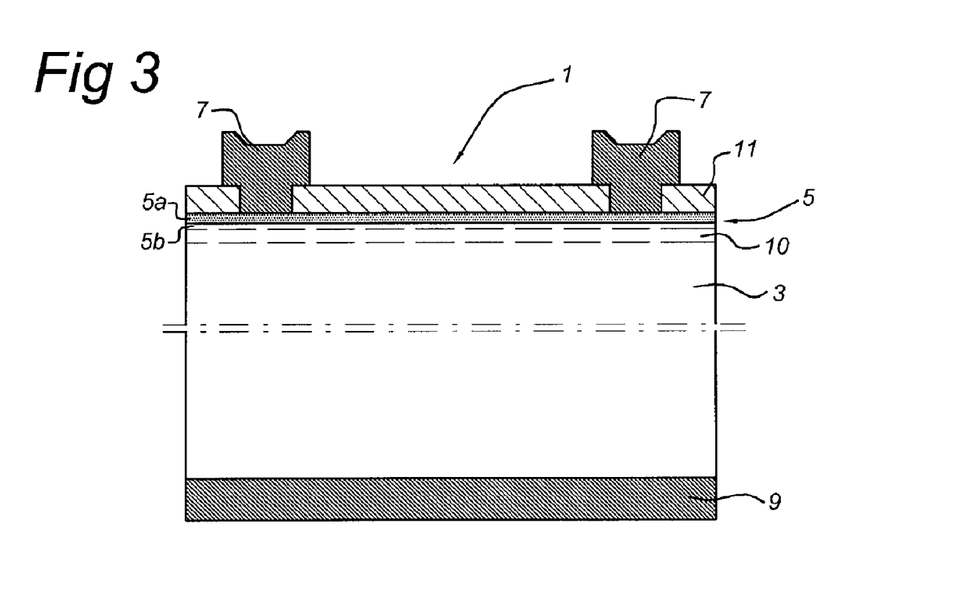
FIG. 3 depicts a cross-sectional view of a radiation detector, according to an embodiment of the invention.

FIG. 3 depicts a cross-sectional view of a radiation detector 1, e.g., TIS 1 or TIS 2 in FIG. 2, or at least part thereof, according to an embodiment of the invention. The radiation detector 1 comprises a silicon (Si) substrate 3, hereinafter referred to as Si-substrate 3. In at least a surface area 10 of the Si-substrate 3, the Si-substrate 3 is provided with doping profile of a certain conduction type. That is, the doping profile may be of a conduction type in which the conduction takes place by means of electrons, i.e., n-type conduction, or of a conduction type in which the conduction takes place by means of holes, i.e., p-type conduction.

On top of the radiation sensitive surface of the radiation detector, a dopant layer 5 is provided. In case the doping profile within the surface area 10 of the Si-substrate 3 relates to n-type conduction, dopant layer 5 is an acceptor layer. In case the doping profile within the surface area 10 of the Si-substrate 3 relates to p-type conduction, the dopant layer 5 is a donor layer.

The radiation detector further comprises two electrodes, i.e., a first electrode 7 and a second electrode 9. The dopant layer 5 may be covered by a protective layer 11 for protecting the radiation detector from the environment. As the radiation needs to pass the protective layer 11, the protective layer is preferably highly transparent to the radiation to be detected.

The first electrode 7 is connected to the dopant layer 5. The first electrode 7 may partly cover the dopant layer 5, as depicted in FIG. 3. This partial overlap ensures a proper connection between the first electrode 7 and the dopant layer 5. As the contact between the first electrode 7 and the dopant layer 5 is larger in size due to the overlap, electrical charge may be removed within a shorter period of time, which may increase the speed in which the radiation detector 1 reacts to short radiation pulses. The first electrode 7 may comprise one or more metallic materials or may be formed from metallic stacks including metallic materials like aluminum (Al), titanium nitride (TiN), titanium (Ti), gold (Au), nickel (Ni), and chrome (Cr).

The second electrode 9 is connected to the Si-substrate 3. The connection may be made with a second surface side of the Si-substrate 3, the second surface side being opposite to the first surface side as is depicted in FIG. 3. A connection as depicted in FIG. 3 between the second surface side of the Si-substrate 3 and the second electrode 9 ensures a homogeneous influence of the second electrode 9. Also the second electrode 9 may comprise one or more metallic materials or may be formed from a metallic stack including metallic materials like Al, TiN, Ti, Au, Ni, and Cr.

The dopant layer 5 comprises two layers: a first layer 5a of dopant material and a second layer 5b which is a diffusion layer. In an embodiment, the dopant material is an acceptor material, like boron (B), gallium (Ga), aluminum (Al), or indium (In). Alternatively, the dopant material may be a donor material like phosphorus (P), arsenic (As), or antimony (Sb).

Embodiments of the invention will further be described with reference to boron as acceptor material. In this case, the second layer 5b is a layer of a $B_xSi_{1-x}$ compound, i.e., boron (B) encompassed in a silicon structure as suitable under the circumstances, x being a value between zero and one.

In an embodiment, the first layer 5a of boron has a thickness of about 1-20 nm. As the transparency of the first layer 5a for radiation with wavelengths between about 10-200 nm is not 100%, the first layer 5a is kept relatively thin to ensure a high sensitivity.

In an embodiment especially suitable for radiation with wavelengths between about 150-200 nm, the second layer 5b of a $B_xSi_{1-x}$ compound has a thickness of about 1-10 nm. This thickness is sufficient to provide a charge response which, due to aforementioned thickness of the second layer 5b, may be transported without undue delays away via the first electrode. In an embodiment, especially suitable for radiation with wavelengths between about 1-150 nm, the second layer 5b of $B_xSi_{1-x}$ has a thickness of about 10-1000 nm.

In an embodiment, the Si-substrate 3 comprises an epitaxial layer of crystalline silicon. In this case, the acceptor layer 5 has been provided on a surface of aforementioned epitaxial layer.

Due to the n-type semiconductor doping profile in at least the surface area 10 of the Si-substrate 3, deposition of the first layer 5a of boron causes development of a pn-junction between the surface area of the Si-substrate 3 and a developing diffusion layer 5b of a $B_xSi_{1-x}$ compound. The n-type semiconductor doping profile in at least the surface area and the diffusion layer are so arranged as to form a radiation sensitive surface of the radiation detector. The radiation sensitive surface is sensitive for radiation with a wavelength between about 10-200 nm. In use, the radiation-sensitive surface, i.e., the surface area of the Si-substrate 3 and the diffusion layer 5b, is at least partly depleted which makes the surface sensitive to aforementioned radiation.

The boron layer 5a and $B_xSi_{1-x}$ compound layer 5b improve hardness, i.e., the ability to withstand degradation, of the radiation detector 1 while they, when their thickness is sufficiently chosen, are sufficiently transparent with respect to the radiation of interest, i.e., wavelengths between about 10 and 200 nm.

In an embodiment, the second layer 5b comprises 2 sub-layers, i.e., a first sub-layer of mono-crystalline $B_xSi_{1-x}$ and a second sub-layer of non-monocrystalline $B_xSi_{1-x}$.

The first sub-layer of mono-crystalline $B_xSi_{1-x}$ is an important layer with respect to transfer of charge from the radiation sensitive surface of the Si-substrate 3 and the first electrode 7.

The second sub-layer of non-monocrystalline $B_xSi_{1-x}$ is located between the first sub-layer and the first layer of boron 5a. The second sub-layer has high sheet resistance but is conductive. The presence of the first layer and the second sub-layer of non-monocrystalline $B_xSi_{1-x}$ suppresses electron injection from Si-substrate 3. Consequently, the transition between the second layer of $B_xSi_{1-x}$ 5b and the Si-substrate 3 is junction-like. The second sub-layer of non-monocrystalline $B_xSi_{1-x}$ may have a thickness of about 0-2 nm. Thus, aforementioned variation in thickness of second layer 5b of $B_xSi_{1-x}$ is, in case aforementioned two sub-layers are present, mainly due to variation in thickness of the first sub-layer of crystalline $B_xSi_{1-x}$.

Figure 4:
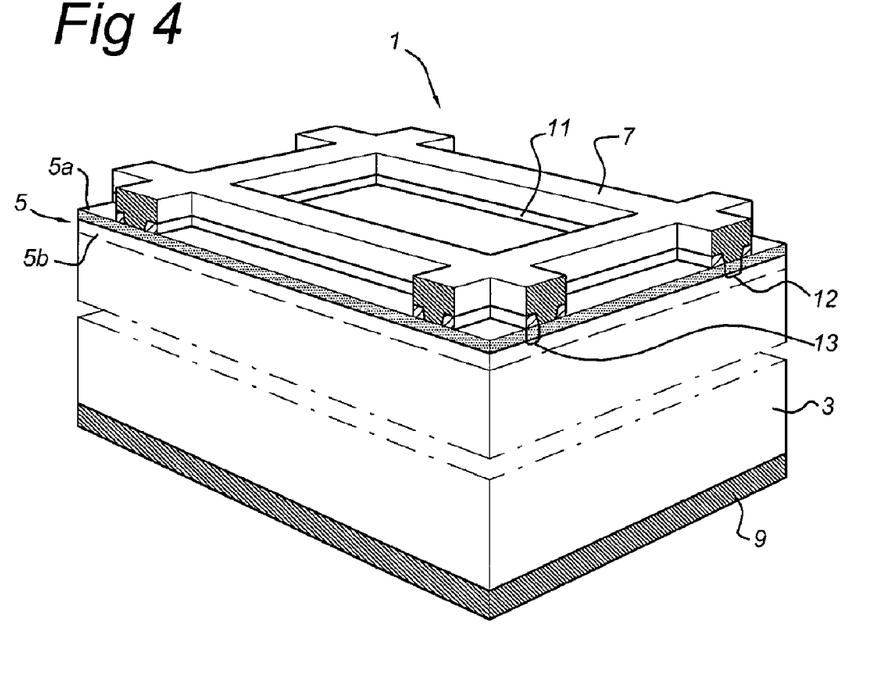
FIG. 4 depicts an elevated side view of the embodiment of the radiation detector depicted in FIG. 3.

FIG. 4 depicts an elevated side view of the embodiment of the radiation detector depicted in FIG. 3. From FIG. 4, it can be seen that the first electrode 7 may be configured as a conductive grid. A conductive grid as depicted in FIG. 4 enables an increased charge removal velocity. As the boron layer is semi-metallic and the $B_xSi_{1-x}$ has high sheet resistance, the read-out speed, which is correlated with the charge removal velocity, becomes slower if the sheet resistance of the $B_xSi_{1-x}$ layer increases. The resistance depends on the distance between the electrode and the location in the $B_xSi_{1-x}$ layer where an electrical charge is induced. The conductive grid limits the maximum value of aforementioned distance. In order to ensure an efficient charge removal, the conductive grid may be circumvented by a conducting ring-shaped electrode (not shown in FIG. 4), which may be located outside the area covered by the radiation-sensitive surface of the radiation detector 1.

The conductive grid forms grid cells. Typical areas of grid cells are 5×5, 10×10 and 20×20 $\mu m^2$. A typical width of the conductive tracks in the conductive grid is 1.0-1.5 $\mu m$. In an embodiment, the conductive grid structure comprises aluminum. Aluminum is a conductive material that may be used in cleanroom environments without additional conditions regarding restricted use.

The radiation sensitive surface of radiation detector 1 comprises first regions 12 and second regions 13. In the first regions 12, the first layer 5a, i.e., the layer of Boron, is connected to the first electrode 7. In the second regions 13, the first layer 5a, i.e., the layer of Boron, is covered with a protective layer 11.

In an embodiment, the second regions 13 have a cumulative surface area of about 10-25 $mm^2$.

The protective layer 11 is optimized to have a high transparency for the radiation to be detected, here electromagnetic radiation with a wavelength between about 10-200 nm. The protective layer 11 is for instance advantageous when using the detector in a lithographic exposure apparatus using EUV radiation. In such a lithographic exposure apparatus, the radiation detector in use becomes contaminated. The contamination is caused by particles comprising carbon released during the exposure of a photoresist layer on a substrate with a patterned beam of EUV radiation. Hydrogen is an effective cleaning material for such contamination. However, hydrogen would interact with materials in the detector causing damage. The protective layer 11 is arranged to shield the detector from the hydrogen and is positioned on the surface of the dopant layer 5 facing away from the surface area 10 and thus the Si-substrate 3. In other words, it is positioned on the side of the detector facing the radiation. At the same time, being positioned on the side facing the radiation, the contamination would be present on the protective layer 11. Thus cleaning the protective layer 11 with hydrogen would provide cleaning of the detector, without causing damage to the detector.

The protective layer 11 may comprise silicon-oxide ($SiO_2$) to form an isolation layer, e.g. provided by means of some type of chemical vapor deposition (CVD) like plasma enhanced CVD or low pressure CVD as will be understood by a person skilled in the art. It must be understood that the protective layer 11 is an optional layer. Process flows exist to provide a metallic grid without use of isolation layer, e.g., an oxide layer.

Figure 5:
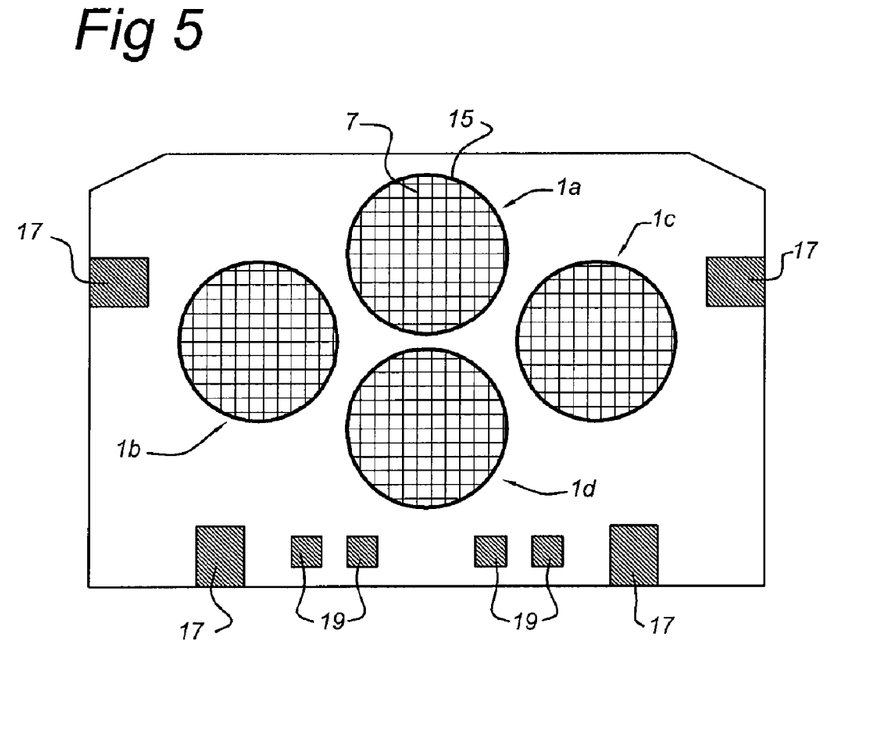
FIG. 5 depicts an assembly of radiation detectors.

FIG. 5 depicts an assembly of radiation detectors according to embodiments of the invention, e.g., the embodiment of a radiation detector 1 as depicted in FIGS. 3 and 4. In the assembly shown in FIG. 5, an embodiment of a radiation detector 1 is used in which the conductive grid 7 is connected with an outer ring-shaped electrode 15 as discussed with reference to FIG. 4. The first electrodes 7 of the respective radiation detectors 1a-d may be controlled by connecting the first electrodes of the respective radiation detectors 1a-d with a corresponding bond pad, e.g., one of bond pads 19. In an embodiment, metal tracks from the first electrodes towards a corresponding bond pad are used for this purpose. The second electrode of the respective detectors 1a-d is common and may be connected by directly contacting directly the second electrode 9.

The assembly of radiation detectors, in FIG. 5 four radiation detectors 1a-d arranged in a symmetric order, is suitable for measuring radiation provided at different illumination settings, e.g., annular illumination, dipole illumination, and quadrupole illumination.

Figure 6:
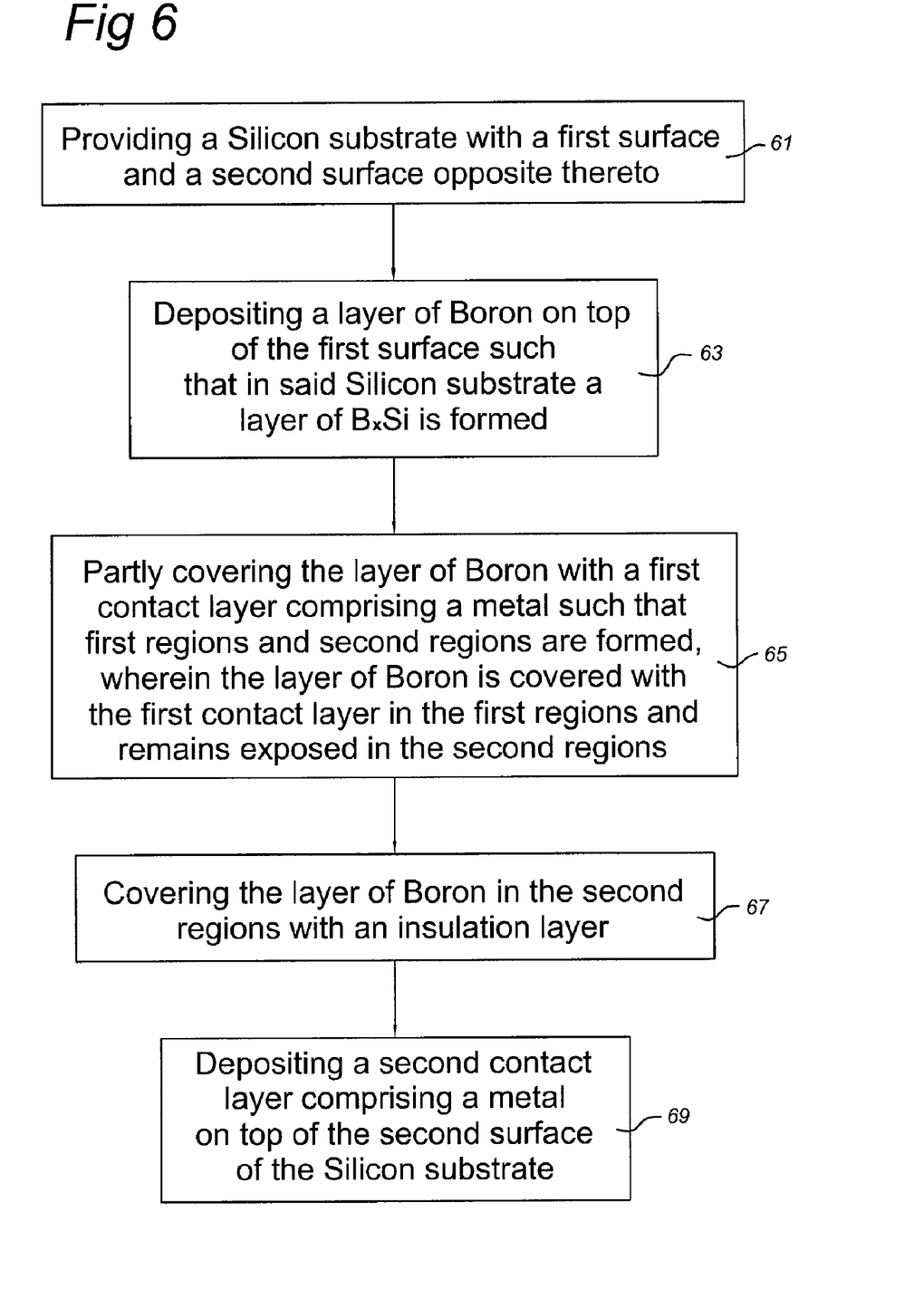
FIG. 6 is a flow diagram of a method of manufacturing, according to an embodiment of a radiation detector.

FIG. 6 is a flow diagram of a method of manufacturing an embodiment of a radiation detector according to the invention.

First, in step 61, a silicon (Si) substrate is provided. The Si substrate has a first surface and a second surface opposite thereto.

Subsequently, in step 63, a layer of boron (B) is deposited on top of the first surface. Deposition is performed such that in the Si substrate a layer of $B_xSi_{1-x}$ is formed. Optimal formation takes place at locations where no oxide is present. In order to ensure an oxide-free surface, etching of an oxide layer to the Si-substrate surface before deposition may be performed.

Subsequently, in step 65, the layer of B is partly covered with a first contact layer comprising a metal, e.g., an electrode 7 or conductive grid as depicted in FIGS. 3 and 4. As a result of the partial covering, first regions and second regions are formed. The layer of B is covered with the first contact layer in the first regions, e.g., the regions where the conductive grid as depicted in FIGS. 4 and 5 is located. The layer of B remains exposed in the second regions, e.g., in the grid cells discussed with reference to FIG. 4.

Then, in step 67, the layer of B in the second regions is covered with a protective layer which is arranged to be highly transparent for the radiation to be detected. The protective layer may comprise silicon-oxide ($SiO_2$) for forming a insulating layer. The layer may be provided by means of some type of chemical vapor deposition (CVD) like plasma enhanced CVD or low pressure CVD as will be understood by a person skilled in the art.

Finally, step 69, a second contact layer comprising a metal is deposited on top of the second surface of the Si-substrate.

Embodiments of the radiation detector may be used in many applications. Possible applications include use as an energy sensor, a spot sensor, and a slit sensor of a high volume EUV lithographic apparatus.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure, or a combination thereof. The patterning device is moved out of the resist leaving a pattern in it after the resist is cured. Embodiments of the invention may be used to provide a radiation detector for detecting the dose of electromagnetic radiation applied for curing the resist.

The terms "radiation" and "beam" used herein encompass all types of electromagnetic radiation, including ultraviolet (UV) radiation (e.g., having a wavelength of or about 365, 355, 248, 193, 157, or 126 μm) and extreme ultra-violet (EUV) radiation (e.g., having a wavelength in the range of 5-20 nm), as well as particle beams, such as ion beams or electron beams. The embodiment of the radiation detector according to the invention as for instance described above in detail may also be used to detect low-energy charged particles such as electrons or plasma particles such as ions. The electrons may have an energy of around 200 eV to around 40 keV.

The term "lens", where the context allows, may refer to any one or combination of various types of optical components, including refractive, reflective, magnetic, electromagnetic, and electrostatic optical components.

While specific embodiments of the invention have been described above, it will be appreciated that the invention may be practiced otherwise than as described.

For example, the invention may take the form of a computer program containing one or more sequences of machine-readable instructions describing a method as disclosed above, or a data storage medium (e.g., semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

The invention claimed is:

1. A detector comprising:
    a substrate having a surface;
    a dopant layer;
    a diffusion layer in contact with the surface of the substrate and the dopant layer, wherein a doping profile, which is representative of a doping concentration of the diffusion layer, increases from the surface of the substrate to the dopant layer;
    a first electrode connected to the dopant layer; and
    a second electrode connected to the substrate;
    wherein the diffusion layer is arranged to form a radiation sensitive surface.

2. The detector of claim 1, wherein the dopant and diffusion layers comprise a dopant material and wherein the doping profile is arranged to provide p-type conduction and the dopant material is an acceptor material.

3. The detector of claim 2, wherein the acceptor material comprises boron, gallium, aluminum, or indium.

4. The detector of claim 1, wherein the dopant and diffusion layers comprise a dopant material and wherein the doping profile is arranged to provide n-type conduction and the dopant material is a donor material.

5. The detector of claim 4, wherein the donor material comprises phosphorus, arsenic, or antimony.

6. The detector of claim 4, wherein the dopant layer is a layer of Boron and the diffusion dopant layer is a layer of a $B_xSi_{1-x}$ compound, x having a value between zero and one.

7. The detector of claim 6, wherein the diffusion layer has a thickness of about 1-10 nm.

8. The detector of claim 6, wherein the diffusion layer has a thickness of about 10-1000 nm.

9. The detector of claim 6, wherein the dopant layer has a thickness of about 1-20 nm.

10. The detector of claim 1, wherein the substrate comprises an epitaxial layer of crystalline silicon, and wherein the diffusion layer has been provided on a surface of the epitaxial layer.

11. The detector of claim 1, wherein the first electrode partly covers the dopant layer.

12. The detector of claim 11, wherein the first electrode is configured as a conductive grid.

13. The detector of claim 1, wherein the first electrode comprises one or more metallic materials comprising aluminum, titanium nitride, titanium, gold, nickel, or chrome.

14. The detector of claim 1, wherein the substrate further comprises a second surface opposite to the first surface, and wherein the second electrode is connected to the second surface.

15. The detector of claim 1, further comprising:
a detector surface comprising first regions and second regions, the first regions being regions where the dopant layer is connected to the first electrode, and the second regions being regions where the dopant layer is covered with a protective layer, the protective layer being configured to pass radiation to be measured by the detector.

16. The detector of claim 15, wherein the second regions have a cumulative surface area of about 10-25 $mm^2$.

17. The detector of claim 1, wherein the radiation sensitive surface is sensitive to radiation wavelengths from approximately 10 nm to approximately 200 nm.

18. The detector of claim 1, wherein the radiation sensitive surface is sensitive to radiation of charged particles.

19. The detector of claim 18, wherein the charged particles are electrons with an energy between around 200 eV and around 40' keV.

20. The detector of claim 1, wherein the substrate comprises a silicon substrate.

21. A lithographic apparatus, comprising:
an illumination system configured to produce a beam of radiation;
a support device configured to support a patterning device that is configured to pattern the beam of radiation;
a projection system configured to project the patterned beam onto a substrate; and
a detector comprising,
a substrate having a surface;
a dopant layer;
a diffusion layer in contact with the surface of the substrate and the dopant layer, wherein a doping profile, which is representative of a doping concentration of the diffusion layer, increases from the surface of the substrate to the dopant layer;
a first electrode connected to the dopant layer; and
a second electrode connected to the substrate;
wherein the diffusion layer is arranged to form a radiation sensitive surface.

22. A method, comprising:
depositing a layer of dopant material on top of a surface of a substrate, such that in the substrate a diffusion layer is formed and so that the dopant layer is arranged to form a radiation sensitive surface, and such that a doping profile, which is representative of a doping concentration of the diffusion layer, increases from the surface of the substrate to the dopant layer;
partly covering the dopant layer with a first contact comprising a conducting material, such that first regions and second regions are formed, such that the dopant layer remains exposable to the radiation in the second regions;
covering the dopant layer with the first contact material in the first regions; and
depositing a second contact comprising a conducting material at a second surface side of the substrate.

23. The method of claim 22, further comprising using a metallic material for at least one of the first contact and the second contact.

24. The method of claim 22, wherein after partly covering the dopant layer with a first contact layer, the method further comprises:
covering the dopant layer in the second regions with a protective layer configured to pass the radiation to be measured by the radiation detector.

25. The detector of claim 1, wherein the diffusion layer comprises a monocrystalline sub-layer in contact with the surface of the substrate and a non-monocrystalline sub-layer in contact with the dopant layer.

26. The detector of claim 1, wherein the radiation sensitive surface is sensitive to electrons.

27. The detector of claim 1, wherein the radiation surface is sensitive for all types of electromagnetic radiation and particle beams.

28. The detector of claim 18, wherein the radiation sensitive surface is sensitive for low-energy charged particles.

29. The detector of claim 1, wherein the dopant layer is an amorphous layer and wherein the diffusion layer is a crystalline layer.

* * * * *

UNITED STATES PATENT AND TRADEMARK OFFICE
CERTIFICATE OF CORRECTION

| | | |
|---|---|---|
| PATENT NO. | : 8,138,485 B2 | |
| APPLICATION NO. | : 12/144874 | |
| DATED | : March 20, 2012 | |
| INVENTOR(S) | : Nihtianov et al. | |

It is certified that error appears in the above-identified patent and that said Letters Patent is hereby corrected as shown below:

Title page, Item (75), Inventor section, after "Petrus Wilhelmus", please delete "Joseph" and insert --Josephus--.

Signed and Sealed this
Fifth Day of June, 2012

David J. Kappos
*Director of the United States Patent and Trademark Office*